United States Patent [19]
Jacob

[11] 3,930,913
[45] Jan. 6, 1976

[54] PROCESS FOR MANUFACTURING INTEGRATED CIRCUITS AND METALLIC MESH SCREENS

[75] Inventor: Adir Jacob, Framingham, Mass.

[73] Assignee: LFE Corporation, Waltham, Mass.

[22] Filed: July 18, 1974

[21] Appl. No.: 489,598

[52] U.S. Cl. .................... 156/8; 156/345; 204/164; 252/79.1
[51] Int. Cl.² ...................... B29C 17/08; C23F 1/02
[58] Field of Search ............... 96/36.2; 156/2, 8, 17, 156/345; 134/1, 31; 204/129.1, 129.35, 129.65, 164

[56] References Cited
UNITED STATES PATENTS

| | | | |
|---|---|---|---|
| 3,615,956 | 10/1971 | Irving | 156/17 |
| 3,664,899 | 5/1972 | Wright | 156/8 |
| 3,795,557 | 3/1974 | Jacob | 156/8 |
| 3,806,365 | 4/1974 | Jacob | 96/36.2 X |
| 3,816,196 | 6/1974 | LaCombe | 156/8 |
| 3,846,166 | 11/1974 | Saiki et al. | 117/212 |

*Primary Examiner*—William A. Powell
*Attorney, Agent, or Firm*—Kenway & Jenney

[57] ABSTRACT

A process step for use in the manufacture of thin film integrated circuits, hybrid circuits and fine metallic mesh screens, to enable the removal of all organics and photoresist material from underlying metallic films without concomitant degradation of the metallic surface. After etching of preselected portions of an underlying critical metallic surface, the material is exposed to a low pressure (few torr) rf generated "cold" plasma, where the plasma is a homogeneous gaseous mixture of oxygen and nitrogen.

12 Claims, 2 Drawing Figures

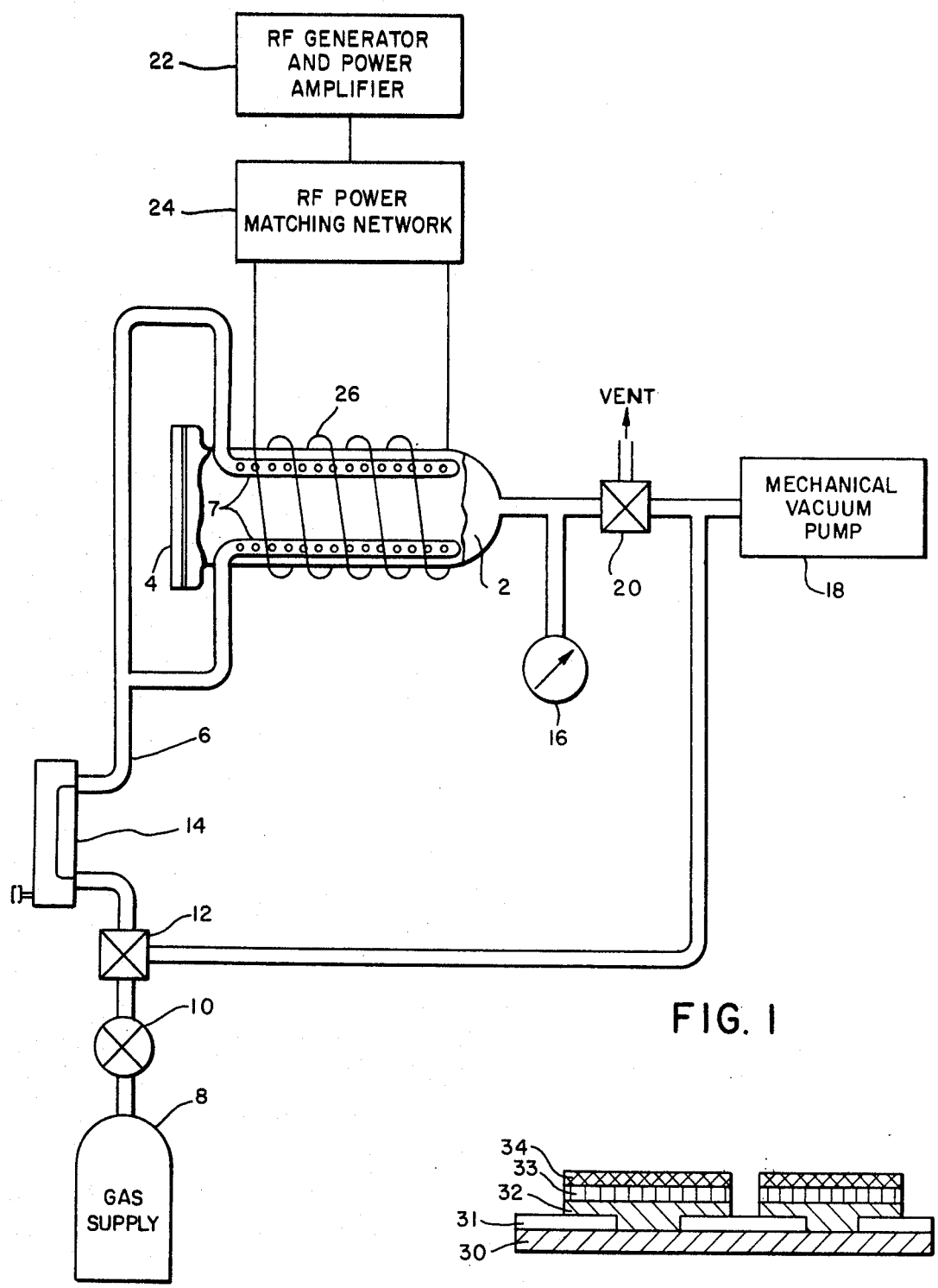

PROCESS FOR MANUFACTURING INTEGRATED CIRCUITS AND METALLIC MESH SCREENS

FIELD OF THE INVENTION

This invention relates in general to a process useful in critical ashing under mild conditions, in analytical procedures and more particularly relates to a process and material useful in the manufacture of integrated and hybrid circuits, where a plasma discharge through air is unacceptable, enabling the removal of photoresist films and other organics from underlying, prone to oxidation, metallic films during the processing of such devices.

BACKGROUND OF THE INVENTION

In one conventional technique for the manufacture of thin film integrated circuits, a relatively thin layer, typically 5,000 to 10,000A of patterned dielectric film is deposited on a slice of semiconductor material (p or n-type) to define those areas on the semiconductor slice where it is desired to generate semiconductor junctions. Typically, after diffusion of dopant material into the areas of the semiconductor slice (where there is no dielectric barrier) aluminum metal is vapor deposited over the entire surface area, followed by its patterning to establish ohmic contacts with the preselected semiconductor junctions. Subsequently a critical metal like copper or nickel is sputtered or vapor deposited over the entire surface area for the purpose of covering the exact underlying areas preliminarily covered by the aluminum layer. This operation requires precision photoresist masking followed by acid etching of the copper or nickel from undesired areas, subsequently followed by the removal of the remainder of the photoresist from the metal covered by it. In the prior art this photoresist stripping is accomplished by means of a digesting solvent that finitely oxidizes or degrades the underlying metal. It is to this metallic surface that high quality connecting leads are attached to enable electrical contact with the outside circuits.

One of the difficulties associated with this particular technique arises from the inability to strip the residual masking photoresist without concomitant oxidation or degradation of the underlying metallic film. The utilization of wet photoresist strippers requires a post wet chemical treatment to restore oxidefree metallic surfaces; these reductants are of no practical value where chemical or physical degradation of the metal occurred, since any such phenomenon will manifest itself as variable surface conductivity yielding a faulty operation of the resultant integrated circuit. Additional drawbacks of the wet chemical approach involve, the contamination of the various solvents and their associated short shelf life, as well as the continuing cost coupled with their use and the inconvenience in rinsing and drying handling procedures prior to the diffusion step, the latter factor being one that ultimately reduces production yields.

SUMMARY OF THE INVENTION

The process of the present invention employs a gas mixture for the generation of a "cold" low pressure (0.05 to ~ 5 torr) plasma having unique characteristics which not only decomposes and volatilizes organic material, but which also simultaneously effects only an insignificant oxidation or degradation of underlying metallic layers. The plasma formed from this particular gas mixture also enables a sequential, different, plasma treatment to practically eliminate any undesirable residues of metal oxides that may have formed during the initial removal of organic matter.

It has been discovered that if the generated plasma includes not only relatively low concentrations of active oxygen, but also reactive species resulting from discharged nitrogen gas, organic material will be removed with negligible adverse attack on underlying metallic films. It is believed that the process is one in which very reactive mixed radicals promote the preferential fragmentation and volatilization of organic material at prevailing relatively low concentrations of oxygen gas. The utilized, initially low, partial pressures of active oxygen in a matrix of nitrogen gas, coupled with its competitive reactions with molecular nitrogen and nitrogen-containing radicals practically reduce the attack of active oxygen on metallic films to insignificant levels. Furthermore, the utilization of nitrogen gas in the plasma state may include favorable energy transfer processes. These processes, which are predominantly the result of bimolecular collisions of excited nitrogen entities with either the substrate material or the other gaseous atoms, molecules, or free radicals may facilitate a variety of desirable chemical conversions while simultaneously inhibiting the overall diffusion of active oxygen species to the solid surface, thereby reducing undesirable and destructive oxidation reactions per unit time.

While a number of gas mixtures within the range of 0.5 to ~ 15% oxygen, balance nitrogen have exhibited acceptable operating characteristics for removal of organic material from underlying, prone to oxidation, metallic surfaces, the optimum binary mixtures appear to be within the range 0.5 – 4% oxygen, balance nitrogen by volume. Binary mixtures in which the oxygen fraction exceeded 7% manifested increased oxidation of nickel mesh, chromium film, and variable sheet resistance and thermal coefficient of resistive films (gold, nichrome, etc.). As the oxygen fraction increases above 15% the oxidation further increases to unacceptable levels. Thus the process may perform acceptably in mixtures which include up to 15 to 20% oxygen by volume.

DESCRIPTION OF THE DRAWING

In the drawing:

FIG. 1 is an illustration in diagrammatic form of a reactor system useful in the process of this invention; and FIG. 2 is an illustration in cross-sectional view of a typical thin film structure at an intermediate stage of the manufacturing process.

DESCRIPTION OF PREFERRED EMBODIMENTS

FIG. 1 depicts diagrammatically an apparatus for use in performing the process described in the invention. The apparatus includes a glass reaction chamber 2, typically made of quartz, having a cover 4 and provided with a gas inlet manifold 6. The side of the reactor 2 has been partially broken away in the drawing so as to better illustrate the gas diffusion tubes 7 which are disposed therein and are externally connected to manifold 6. A pressurized gas supply 8 is connected through a pressure regulating valve 10 and flowmeter 14 to manifold 6. A vacuum gauge 16 provides an indication of total reaction pressure in reactor 2. A source of radio frequency power 22 is coupled through a matching network 24 to inductance 26 surrounding the reaction chamber 2.

In operation, the gaseous mixture comprised of oxygen and nitrogen is admitted to reaction chamber 2, where the coupled radio-frequency energy creates a "cold" plasma. The material to be processed is placed within reactor 2, where it is exposed to the plasma. Such a reaction chamber is commercially available from the Process Control Division of LFE Corporation, under the trade designation PDS-302, PDS-501, PDS-504 or PDS-1002. Typically, the rf power per reactor is between 150 to 600W continuous radiation at 13.5MHz.

The general process is one in which substrate wafers, chrome or iron oxide plated photomasks, or critical metallic mesh screens at an appropriate stage of the manufacturing process are placed in reactor 2 and exposed to the plasma generated by the admission of an appropriate gaseous mixture of oxygen and nitrogen. For the appropriate reactions to take place, and in order to provide an effective process, it is important that this homogeneous mixture be formed prior to its entering the reaction chamber so that prescribed competitive-consecutive action will take place when the rf discharge strikes.

In FIG. 2 there is shown in cross-sectional view, a portion of a thin film integrated circuit at a suitable processing stage for the utilization of this invention. The semiconductor substrate 30 having a relatively thin (2,000 to 10,000A) layer of dielectric 31 on its upper surface, would usually be silicon covered partially with a silicon dioxide film serving as a diffusion barrier, although other semiconductor materials may either have a deposited silicon dioxide film or another passivation film deposited onto them. This dielectric layer 31 has been patterned to accommodate an aluminum metallization layer 32 that subsequently accepts a vapor deposited or sputtered metallic layer 33 of copper or nickel on to it through corresponding openings in the overlying photoresist layer 34. At this stage of the process, it is necessary to remove the photoresist layer 34 without adversely oxidizing or degrading the critical metal 33 covered by it.

If the thin film structure, as depicted in FIG. 2, is exposed to the prescribed plasma formed from a gaseous mixture of oxygen and nitrogen, the photoresist material 34 will be removed without simultaneous degradation or oxidation of the underlying metallic film 33. It has been found that a preferred binary mixture should be selected within the mixture range of 0.5 to 4% oxygen gas by volume. In practice, this mixture is supplied from one container, but in principle could be supplied from two independent pressurized sources. However, satisfactory results were achieved with gaseous mixtures in which the volume percent of oxygen was lower and that of nitrogen higher. In general, a decrease in the oxygen fraction tends to slow down the removal of organic matter, while an increase in the mole fraction of the oxygen gas (above 7% by volume) tends to result in excessive removal of organic material along with oxidation of the metal 33. Too little oxygen (below 1% by volume), however, may result in excessively slow removal of organic matter.

The successful operation of this process is believed to include competitive reactions in the generated plasma, such that the presence of molecular nitrogen, nitrogen atoms and nitrogen atom-containing free radicals reduces the oxidation probability of critical exposed metallic areas. The correspondingly anticipated decrease in removal of organic matter due to reduction of available active oxygen is apparently overcompensated by organic material fragmentation and volatilization by active nitrogen and nitrogen-containing free radicals. The smallest residual metal oxide contamination that may be left on the metallic surface 33 after the stripping of the photoresist layer 34 may be removed in a sequential plasma-based reducing step utilizing rf discharged hydrogen gas or its binary mixtures with other gases; e.g., helium, argon, etc.

It has been found that the mixtures set forth below in the examples within the range of mixture composition as designated, produce acceptable results in the processes described.

Example 1

| Binary Mixture Expressed As Volume % Of Oxygen Gas (%) | Rate of Removal (A/Min) | Observed Results |
|---|---|---|
| \multicolumn{3}{l}{Removal of Organic Photoresist From Copper And Fine Nickel Mesh} | | |
| 0.5 | Slow, <50 | Insignificant Oxide Formation |
| 1.5 | Slow-to-Moderate, <300 | Insignificant Oxide Formation |
| 2.0 | Moderate, >500 | Insignificant Oxide Formation |
| 2.5 | Moderate, >500 | Insignificant Oxide Formation |
| 3.0 | Moderate-to-Fast, <1000 | Insignificant Oxide Formation |
| 4.0 | Fast, >2000 | Insignificant Oxide Formation |
| 4.5 | Fast, >2000 | Insignificant Oxide Formation |
| 5.0 | Fast, >2000 | Insignificant Oxide Formation |
| 6.0 | Fast, >2500 | Moderate Oxide Formation |
| 7.0 | Fast, >2500 | Moderate Oxide Formation |
| 8.0 | Fast, >2500 | Moderate-to-Excessive Oxide Formation |
| 9.0 | Fast, >2500 | Moderate-to-Excessive Oxide Formation |
| 10.0 | Fast, >2500 | Excessive Oxide Formation |
| 12.0 | Fast, >2500 | Excessive Oxide Formation |
| 15.0 | Fast, >2500 | Excessive Oxide Formation |

Example 2

| Binary Mixture Expressed As Volume % of Oxygen Gas (%) | Rate of Removal (A/Min) | Observed Results |
|---|---|---|
| Removal of Organic Photoresist From Chromium Photomasks* | | |
| 0.5 | Slow, <50 | Insignificant Oxide Formation |
| 1.0 | Moderate, >500 | Insignificant Oxide Formation |
| 1.5 | Moderate-to-Fast, <1000 | Insignificant Oxide Formation |

Example 2-continued

Removal of Organic Photoresist From Chromium Photomasks*

| Binary Mixture Expressed As Volume % of Oxygen Gas (%) | Rate of Removal (A/Min) | Observed Results |
|---|---|---|
| 1.75 | Fast, <2000 | Insignificant Oxide Formation |
| 2.0 | Fast, >2500 | Insignificant Oxide Formation |
| 2.5 | Fast, >2500 | Moderate Oxide Formation |
| 3.0 | Fast, >2500 | Moderate-to-Excessive Oxide Formation |
| 4.0 | Fast, >2500 | Excessive Oxide Formation |

*Enhanced chromium hardness observed; scratch-proofness accentuated — probably due in part to corresponding nitride formation.

Example 3

Removal Of Organic Photoresist From Nichrome, Gold and Chrome/Cobalt Resistive Films

| Binary Mixture Expressed As Volume % Of Oxygen Gas (%) | Rate of Removal (A/Min) | Observed Results |
|---|---|---|
| 0.5 | Slow, <50 | Insignificant Change In Sheet Resistance and Thermal Coefficient Of Resistance (TCR) |
| 1.0 | Slow, >100 | Insignificant Change In Sheet Resistance and TCR |
| 1.5 | Slow-to-Moderate <300 | Insignificant Change In Sheet Resistance and TCR |
| 2.0 | Moderate, >500 | Insignificant Change In Sheet Resistance and TCR |
| 3.0 | Moderate-to-Fast, <1000 | Insignificant Change In Sheet Resistance and TCR |
| 4.0 | Fast, >2000 | Insignificant Change In Sheet Resistance and TCR |
| 4.5 | Fast, >2000 | Insignificant Change In Sheet Resistance and TCR |
| 5.0 | Fast, >2000 | Insignificant Change in Sheet Resistance; Moderate change in TCR |
| 6.0 | Fast, >2500 | Moderate Change in Sheet Resistance and TCR |
| 7.0 | Fast, >2500 | Moderate Change in Sheet Resistance and TCR |
| 8.0 | Fast, >2500 | Moderate-to-Excessive Change in Sheet Resistance and TCR |
| 9.0 | Fast, >2500 | Moderate-to-Excessive Change in Sheet Resistance and TCR |
| 10.0 | Fast, >2500 | Excessive Change in Sheet Resistance and TCR |
| 12.0 | Fast, > 2500 | Excessive Change in Sheet Resistance and TCR |
| 15.0 | Fast, >2500 | Excessive Change in Sheet Resistance and TCR |

What is claimed is:

1. In a process for the manufacture of thin film integrated circuits including a step in which a patterned layer of organic material is overlaid on a metallic layer, the improvement in the further step of removing the organic material comprising the step of:
   - exposing the organic material to a low temperature, low pressure plasma formed from a gaseous mixture of oxygen and nitrogen, wherein the oxygen fraction lies within the range of 0.5 to 15% by volume.

2. A process as in claim 1 wherein the gaseous multicomponent mixture is supplied from a single pressurized source.

3. The improvement of claim 1 when the metallic layer is copper metal, wherein the oxygen component is 4%, balance nitrogen by volume.

4. A process as in claim 1 wherein the reaction pressure is in the range 0.05 to 5 torr.

5. A process as in claim 1 wherein the reaction temperature is below 300°C.

6. The process of claim 1 wherein said organic material is photoresist.

7. A process as in claim 6 deployed with underlying nickel-chrome (nichrome) resistive film, wherein the oxygen component is 4%, balance nitrogen by volume.

8. A process as in claim 4 deployed with underlying chrome-cobalt resistive film, wherein the oxygen component is 4%, balance nitrogen by volume.

9. A process as in claim 6 deployed with underlying gold conductors, wherein the oxygen component is 4%, balance nitrogen by volume.

10. In a process for the fabrication of chromium photomasks including a step in which a patterned layer of photoresist is overlaid on said chromium, the improvement in the further step of removing the photoresist comprising the step of:
    exposing the photoresist material to a low temperature, low pressure plasma formed from a gaseous mixture of oxygen and nitrogen wherein the oxygen component is 2%, balance nitrogen by volume.

11. In a process for the fabrication of nickel mesh screens including a step in which a patterned layer of photoresist is overlaid on said nickel, the improvement in the further step of removing the photoresist comprising the step of:
    exposing the photoresist material to a low temperature, low pressure plasma formed of a gaseous mixture of oxygen and nitrogen wherein the oxygen component is 4%, balance nitrogen by volume.

12. In a process for the fabrication of copper mesh screens including a step in which a patterned layer of photoresist is overlaid on said copper, the improvement in the further step of removing the photoresist comprising the step of:
    exposing the photoresist material to a low temperature, low pressure plasma formed of a gaseous mixture of oxygen and nitrogen wherein the oxygen component is 0.5%, balance nitrogen by volume.

* * * * *